United States Patent [19]

Takeuchi et al.

[11] 4,296,427
[45] Oct. 20, 1981

[54] REVERSE CONDUCTING AMPLIFIED GATE THYRISTOR WITH PLATE-LIKE SEPARATOR SECTION

[75] Inventors: Minami Takeuchi, Tokyo; Minoru Kuriki, Kawasaki, both of Japan

[73] Assignee: Tokyo Shibaura Electric Co., Ltd., Japan

[21] Appl. No.: 70,655

[22] Filed: Aug. 28, 1979

Related U.S. Application Data

[63] Continuation of Ser. No. 802,070, May 31, 1977, abandoned.

[30] Foreign Application Priority Data

May 31, 1976 [JP] Japan .................... 51/63242

[51] Int. Cl.$^3$ .......................... H01L 29/747
[52] U.S. Cl. ........................ 357/39; 357/20; 357/38; 357/86
[58] Field of Search ............... 357/38, 39, 86, 20

[56] References Cited

U.S. PATENT DOCUMENTS

| | | | |
|---|---|---|---|
| 3,280,386 | 10/1966 | Philips | 357/39 |
| 3,337,783 | 8/1967 | Stehney | 357/86 |
| 3,360,696 | 12/1967 | Neilson et al. | 357/39 |
| 3,408,545 | 10/1968 | De Cello et al. | 357/39 |
| 3,443,171 | 5/1969 | Knott et al. | 357/39 |
| 3,549,961 | 12/1970 | Gault | 357/39 |
| 3,590,346 | 6/1971 | Bilo et al. | 357/38 |
| 3,731,162 | 5/1973 | Suenaga et al. | 357/39 |
| 3,794,890 | 2/1974 | Weimann et al. | 357/38 |
| 3,827,073 | 7/1974 | Mize | 357/39 |
| 3,893,153 | 7/1975 | Page et al. | 357/38 |
| 3,947,864 | 3/1976 | Yatsuo et al. | 357/39 |
| 3,978,514 | 8/1976 | Ogawa et al. | 357/39 |
| 4,028,721 | 6/1977 | Yatsuo et al. | 357/38 |
| 4,031,607 | 6/1977 | Cline et al. | 357/39 |

FOREIGN PATENT DOCUMENTS

| | | | |
|---|---|---|---|
| 2157091 | 5/1973 | Fed. Rep. of Germany | 357/38 |
| 2214187 | 9/1973 | Fed. Rep. of Germany | 357/39 |
| 2261666 | 6/1974 | Fed. Rep. of Germany | 357/39 |
| 2300754 | 7/1974 | Fed. Rep. of Germany | 357/38 |
| 43-10766 | 5/1968 | Japan | 357/38 |

OTHER PUBLICATIONS

J. Garrett, "The Evolution of a High-Power Fast-Switching Thyristor," Elect, Ewgr. vol. 48 #5, May 1971, pp. 33-35.

E. Wolley et al., "Char. of a 200 AMP G to Thyristor," IEEE Conf. Rec. of IAS/1973 Ann. Meet. IEEE Ind. App. Soc., 73 cho 763-31A, pp. 251-255.

*Primary Examiner*—Joseph E. Clawson, Jr.
*Attorney, Agent, or Firm*—Finnegan, Henderson, Farabow, Garrett & Dunner

[57] ABSTRACT

A reverse conducting thyristor comprises a thyristor section, a diode section and a separator section. The three sections are integrally formed into a cylindrical body. The thyristor section is constituted by a first region of a first conductivity type, a second region of the second conductivity type, a third region of the first conductivity type, a main emitter region of the second conductivity type, a cathode electrode, an auxiliary emitter region, an auxiliary gate electrode and a main gate electrode.

The first region is formed on a first electrode, the second region on the first region, and the third region on the second region. The main emitter region is so formed in the third region as to have its surface on the same level with that of the third region. The auxiliary emitter region is similarly formed in the third region and faces at least a part of that periphery of the main emitter region which does not contact the separator section. The cathode electrode is formed on the main emitter region. The auxiliary gate electrode is formed partly on the third region and partly on the auxiliary emitter region and is arched concentrically with the cylindrical body so as to surround at least a part of said periphery of the main emitter region. The main gate electrode is formed on that surface portion of the third region which is adjacent to that lateral surface of the auxiliary emitter region which does not face the main emitter region.

The diode section comprises a fourth region of the second conductivity type, a fifth region of the first conductivity type and a second electrode. The fourth region is formed on the first electrode, the fifth region on the fourth region, and the second electrode on the fifth region.

The separator section is a plate which is constituted by a sixth region of the first conductivity type, a seventh region of the second conductivity type and an eight region of the first conductivity type. The sixth region is formed on the first electrode, the seventh region on the sixth region, and the eighth region on the seventh region.

1 Claim, 13 Drawing Figures

REVERSE CONDUCTING AMPLIFIED GATE THYRISTOR WITH PLATE-LIKE SEPARATOR SECTION

This is a continuation of application Ser. No. 802,070, filed 5/31/77 now abandoned.

BACKGROUND OF THE INVENTION

This invention relates to a reverse conducting thyristor having a thyristor section, a diode section and a semiconductor separator section.

A reverse conducting thyristor comprises a thyristor section, a diode section and a seimconductor separator section which are formed integrally. The seimconductor separator section is interposed between the thyristor and diode sections and prevents electrical interference therebetween. Such a reverse conducting thyristor is employed chiefly as a chopper device or an inverter device, and should therefore have a great turn-off ability. Since a large current flows through it, the thyristor section should have a large effective area. In addition, the effective area of the diode section should be made sufficiently large. To improve the turn-off ability of the thyristor, it is necessary to shorten the turn-off time and to prevent the thyristor section from being refired by residue charge in the diode region.

To facilitate the understanding of a reverse conducting thyristor, a chopper circuit including reverse conducting thyristors will be explained with reference to FIGS. 1, 2A and 2B.

In the chopper circuit shown in FIG. 1, a main reverse conducting thyristor I is connected through a load M between the positive and negative poles of a DC power source. Between the terminals of the thyristor I there is connected an auxiliary thyristor II through an inductor L and a capacitor C. First, a gate signal is supplied to the gate of the thyristor I, thus making current $I_{DC}$ flow through the load M. Then, a gate signal is supplied to the gate of the thyristor II. As a result, the thyristor I is turned off while the thyristor II is rendered conductive.

While current $I_{DC}$ is flowing through the load M, the capacitor C is charged. If the auxiliary thyristor II is turned on under this condition, both current $I_{DC}$ and the current discharged from the capacitor C flow through the thyristor section of the main thyristor I for a period $T_0$ as shown in FIG. 2A. In period $t_{p1}$ the polarity of the capacitor C is reversed. Then, the current discharged from the capacitor C flows through the diode section of the main thyristor I, and the thyristor I is turned off. A pulse current as shown in FIG. 2B flows through the thyristor and diode sections of the auxiliary thyristor II during a time period $t_{p2}$, respectively. Since the current flowing through the diode section of the main thyristor I is smaller by current $I_{DC}$ than the current flowing through the diode section of the thyristor II, the pulse width of the pulse current of the diode section of the thyristor II becomes extremely small.

If either thyristor fails to be turned off as in case it is re-fired, the pulse current continues to flow through the thyristor sections of both thyristors I and II. In this case, the pulse current change rate di/dt is very high, and the thyristor section of each thyristor should withstand such a high current change rate di/dt. To this end, the thyristor section of each thyristor should be fired very rapidly; its firing area should expand very quickly.

Through the diode section of either thyristor there flows a pulse current having a small pulse width. This pulse current is therefore doomed to attenuate very quickly. The quick attenuation of the current adversely builds up a residue charge in the diode section. The residue charge thus built up may often cause the thyristor section to be re-fired. To prevent such a re-firing of the thyristor section, the separator section is provided between the thyristor and diode sections.

On the other hand, through the thyristor section of thyristor II flows such a large current as shown in FIG. 2A. It is therefore required that the effective area of the thyristor section should be made larger in order to reduce the voltage drop in forward direction as much as possible. Apparently, the effective area of the thyristor should be increased if a great current is to flow through the thyristor section.

A conventional reverse conducting thyristor has such a construction as shown in FIGS. 3A to 3C. FIG. 3A is an upper plan view of the conventional thyristor, and FIG. 3B is a cross-sectional view of the thyristor taken along line 3B—3B in FIG. 3A. As illustrated in FIG. 3B, there is mounted on the central part of an anode electrode 1 a cylindrical diode section 2 which is constituted by an N+ layer, an N layer and a P layer. The diode section 2 is surrounded by a hollow cylindrical separator section 3 which is constituted by a P₁ layer, an N layer and a P₂ layer. On the periphery of the separator section 3 a ring-shaped thyristor section 4 is provided. The thyristor section 4 is constituted by a ring-shaped P₁ layer, a ring-shaped N layer, a ring-shaped P₂ layer, a main emitter region 5 and an auxiliary emitter region 6. The P₁ layer is formed on the anode electrode 1, the N₁ layer on the P₁ layer, and the P₂ layer on the N₁ layer. The main emitter region 5 is so formed in the P₂ layer as to have its surface at the same level with that of the P₂ layer. The auxiliary emitter region 6 is formed similarly in the P₂ layer and faces at least a part of an outer peripheral of the main emitter region. On the main emitter region 5, the separator section 3 and the diode section 2 a cathode electrode K is formed. Further, an auxiliary gate electrode 7 is provided around the cathode electrode K and touches the auxiliary emitter region 6, and a main gate electrode G is connected to that surface portion of the P₂ layer which is nearer to the auxiliary emitter region 6 than to the main emitter region 5.

In the reverse conducting thyristor of the abovementioned construction, the auxiliary gate electrode 7 surrounds the entire periphery of the main emitter region 5, and the separator section 3 is a hollow cylinder. It is therefore difficult to increase the effective areas of the main emitter region 5 and the diode section 2, through which the thyristor current and the diode current are to flow, respectively. That is, if the outer radius of the auxiliary gate electrode 7, the outer radius of the cathode electrode K, the outer radius of the separator section 3 and the inner radius of the separator section 3 are denoted by $R_1$, $R_2$, $R_3$ and $R_4$, respectively as shown in FIG. 3C, the ineffective area where neither thyristor current nor diode current flows is very large as hatched in FIG. 3C. Since the effective area of, for example, the thyristor section 4 is so small that the voltage drop in the forward direction will become too high.

Accordingly, the object of this invention is to provide a reverse conducting thyristor whose turn-off time is shortened and whose thyristor and diode sections have a relatively large effective area where current may flow.

SUMMARY OF THE INVENTION

A reverse conducting thyristor according to this invention comprises a thyristor section, a diode section and a semiconductor separator section interposed between the thyristor and diode sections so as to avoid electrical interference therebetween. These three sections are integrally formed in a cylindrical body.

The thyristor section includes a first region of a first conductivity type formed on a first electrode, a second region of the second conductivity type formed on the first region, a third region of the first conductivity type formed on the second region, a main emitter region of the second conductivity type formed in the third region, a cathode electrode formed on the main emitter region and having a periphery arched concentrically with the cylindrical body, an auxiliary emitter region so formed in the third region as to face, through the material of the third region, at least a part of that periphery of the main emitter region which does not contact the separator section, an auxiliary gate electrode formed partly on the third region and partly on the auxiliary emitter region and so arched concentrically with the cylindrical body as to surround, through the material of the third region, at least a part of that periphery of the main emitter region which does not contact the separator section, and a main gate electrode formed on that surface portion of the third region which is adjacent to that lateral surface of the auxiliary emitter region which does not face the main emitter region.

The diode section includes a fourth region of the second conductivity type formed on the first electrode, a fifth region of the first conductivity type formed on the fourth region, and a second electrode formed on the fifth region, connected to the cathode region and having a periphery arched concentrically with the cylindrical body.

The semiconductor separator section is a plate constituted by a sixth region of the first conductivity type formed on the first electrode, a seventh region of the second conductivity type formed on the sixth region, and an eighth region of the first conductivity type formed on the seventh region.

According to this invention, the thyristor section is separated from the diode section by the plate-shaped separator section, and the auxiliary gate electrode surrounds at least a part of that periphery of the main emitter region which does not contact the separator section. For this reason, the sum of the effective areas of the main emitter region and the diode section can be made larger than in the prior art reverse conducting thyristor. Since said periphery of the main emitter region is surrounded by the auxiliary gate electrode, the fired area in the main emitter region can expand very quickly. Thus, neither a local current accumulation nor a local temperature rise occurs in the main emitter region even if a pulse current of a small pulse width flows through the thyristor section. This shortens the turn-off time of the thyristor. As a result, failure of turn-off operation is prevented.

DETAILED DESCRIPTION OF THE PREFERRED EMBODIMENTS

Figure 4A:
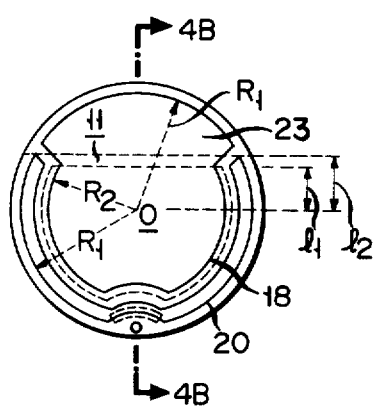
FIG. 4A is a plan view of a first embodiment of this invention.
Figure 4B:
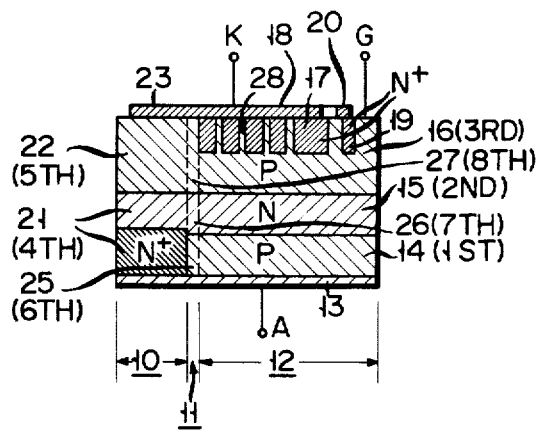
FIG. 4B is a cross-sectional view of the first embodiment, taken along line 4B—4B in FIG. 4A.
Figure 4C:
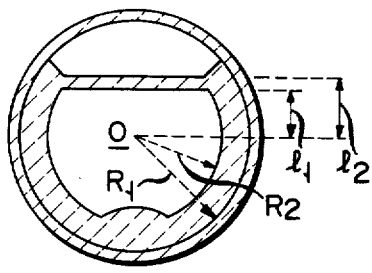
FIG. 4C shows where in the first embodiment the main thyristor current and the diode current flow and do not flow.

As shown in FIGS. 4A to 4C, a reverse conducting thyristor according to this invention comprises a diode section 10, a separator section 11 and a thyristor section 12, which are integrally formed into a cylindrical body. The thyristor section 12 includes a P type first region 14 formed on a first electrode 13 which acts as an anode to the thyristor section and a cathode to the diode section, an N type second region 15 formed on the first region 14, a P type third region 16 formed on the second region 15, an N type main emitter region 17 one lateral surface of which contacts the separator section 11, a cathode electrode 18 formed on the main emitter region 17, and N+ type auxiliary emitter region 19, an auxiliary gate electrode 20, and a main electrode G. The main emitter region 17 is so formed in the third region 16 as to have its surface on the same level with that of the third region 16. Similarly, the auxiliary emitter region 19 is so formed in the third region 16 as to have its surface on the same level with that of the third region 16 and to face, through the material of the third region, a part of that periphery of the main emitter region 17 which does not contact the separator section 11. The auxiliary gate electrode 20 is formed partly on the third region 16 and partly on the auxiliary emitter region 19 and so arched concentrically with the cylindrical body as to surround, through the material of the third region, that periphery of the main emitter region 17 which does not contact the separator section 11. The main gate electrode G is provided on that surface portion of the third region 16 which is adjacent to that lateral surface of the auxiliary emitter region 19 which does not face the main emitter region 17.

The diode section 10 includes an (N+ +N) type fourth region 21 formed on the first electrode 13, a P type fifth region 22 formed on the fourth region 21, and a second electrode 23 formed on the fifth region 22. The separator section 11 includes a P type sixth region 25 which is a portion of the first region 14, an N type seventh region 26 which is a portion of the second region 15 and a P type eighth region 27 which is a portion of the third region 16. As shown in FIGS. 4A and 4B, the separator section 11 is shaped like a plate.

In FIG. 4B, the cathode electrode 18 and the second electrode 23 are integrally formed. But they may be separatedly formed, and then be connected electrically. The main emitter region 17 has a plurality of through holes 28. These holes 28 are filled up with the P type semiconductor material of the third region 16. Thus, through the holes 28 a displacement current, if generated in the thyristor section 12, can be guided by the P type semiconductor material to the cathode electrode 18. This particular structure of the main emitter region is generally known as "shorted emitter structure".

Figure 1:
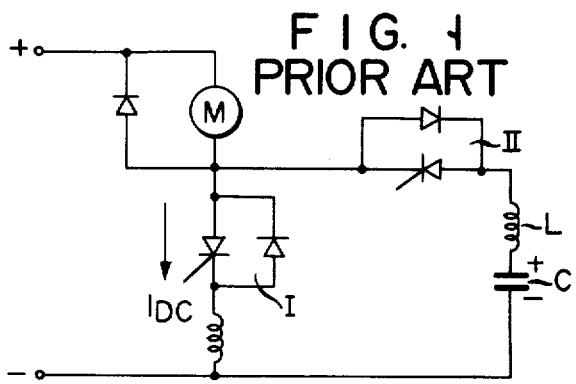
FIG. 1 shows a chopper circuit including reverse conducting thyristors.
Figure 2A:
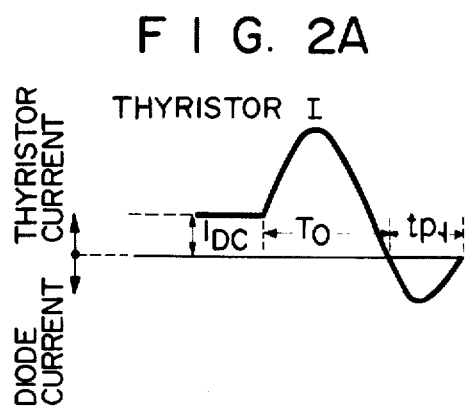
FIGS. 2A and 2B show the pulse waveforms of a current flowing through the reverse conducting thyristors shown in FIG. 1.
Figure 2B:
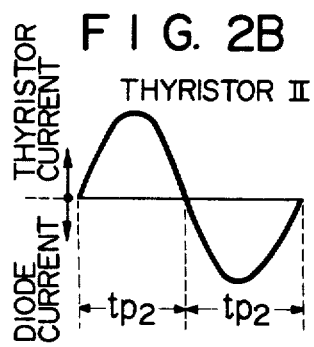
Figure 3A:
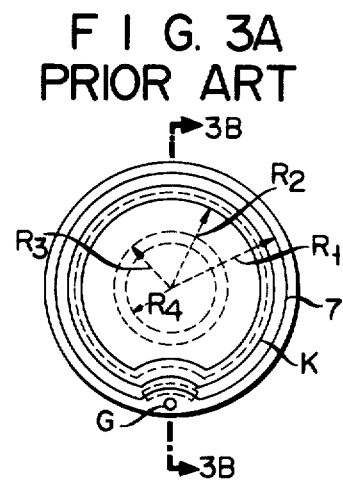
FIG. 3A is an upper plan view of a conventional reverse conducting thyristor.
Figure 3B:
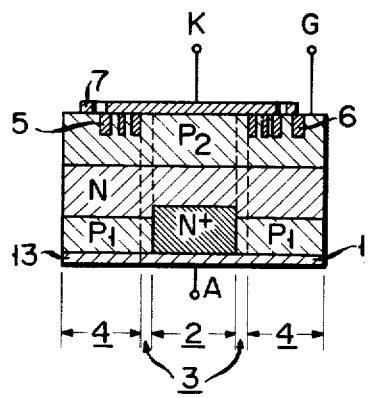
FIG. 3B is a cross-sectional view of the thyristor of FIG. 3A, taken along line 3B—3B.
Figure 3C:
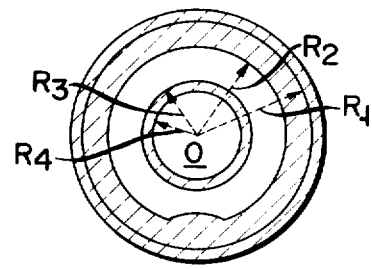
FIG. 3C shows where in the thyristor of FIGS. 3A and 3B the main thyristor and diode currents flow and do not flow.

Suppose the thyristor of FIGS. 4A and 4B and the prior art thyristor of FIGS. 3A and 3B have the same diameter and that the axes of these cylindrical thyristors pass through point O as shown in FIGS. 3C and 4C. In FIG. 3C, $R_1$, $R_2$, and $R_4$ denote the outer radius of the auxiliary gate electrode 7, the outer radius of the cathode electrode K, the outer radius of the separator section 3 and the inner radius of the separator section 3, respectively. Likewise in FIG. 4C, $R_1$, $R_2$, $l_1$ and $l_2$ denote the outer radius of the auxiliary gate electrode 20, the outer radius of the cathode electrode 18, the distance between point O and that side of the separator section 11 which contacts the thyristor section 12, and the distance between point O and the other side of the separator section 11 which contacts the diode section 10, respectively. Here, it is assumed that the hollow cylindrical separator section 3 (FIG. 3B) and the plate-shaped separator section 11 (FIG. 4B) have the same thickness:

$(R_3-R_4)=(l_2-l_1)$.

Suppose the diameter of both thyristors is 40 mm, $R_1$ is 36/2 mm, $R_2$ is 32/2 mm, $l_2$ is 10.5 mm, $l_1$ is 9.5 mm, $R_3-R_4$ and $l_2-l_1$ is 1.0 mm, the area of the diode section is 154 mm² (i.e. the equivalent diameter of the diode section 2 is approximately 14 mm), and the area of the P region in the holes 28 occupies 8% of the entire area of the main emitter region. Then, the prior art thyristor (FIG. 3C) has an effective area of 555 mm², and the thyristor according to this invention (FIG. 4C) has an effective area of 610 mm². Thus, in this case the latter has an effective area about 10% larger than that of the former.

It will now be explained how the thyristor shown in FIGS. 4A to 4C operates. First, a forward voltage is applied between the first electrode 13 (i.e. anode electrode) and the cathode electrode 18. Then a gate voltage is applied between the main gate electrode G and the cathode electrode 18. In this case, an auxiliary thyristor section which corresponds to the auxiliary emitter region 19 is fired. As a result, the potential of the auxiliary gate electrode 20 elevates, and a main thyristor section which corresponds to the main emitter region 17 is fired. The firing of the main emitter region 17 starts simultaneously at any peripheral portions which face the arched auxiliary gate electrode 20 and develops therefrom. For this reason, the current does not accumulate in a limited portion of the main emitter region 17, and no local temperature rise occurs in the main emitter region 17. The turn-off time of the thyristor therefore need not be lengthened. Since the effective area of the thyristor section 12 through which the thyristor current is to flow is large as mentioned above, the voltage drop in forward direction becomes small. This also serves to provide a reverse conducting thyristor having improved characteristics over a conventional one.

Figure 5:
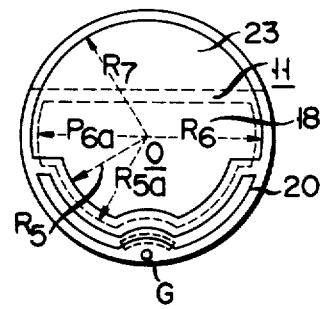
FIG. 5 is an upper plan view of a modification of the first embodiment.

In the modified thyristor shown in FIG. 5, the main emitter region 17 consists of a portion having a small radius $R_{5a}$ and a portion having a large radius $R_{6a}$. The cathode electrode 18, which is formed on the main emitter region 17, also consists of a portion having a small radius $R_5$ and a portion having a large radius $R_6$. The radius $R_7$ of the second electrode 23 is equal to the large radius $R_6$ of the cathode electrode 18. This means that these electrodes 18 and 23 are integrally formed into one piece. Thus, the thyristor section can withstand a higher voltage change rate dV/dt than otherwise.

Figure 6A:
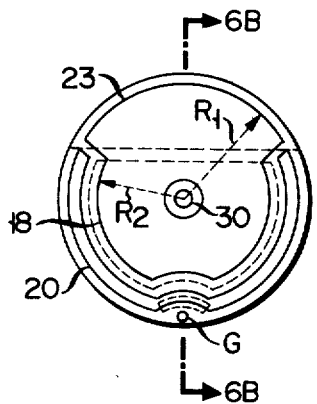
FIG. 6A is an upper plan view of a second embodiment of this invention.
Figure 6B:
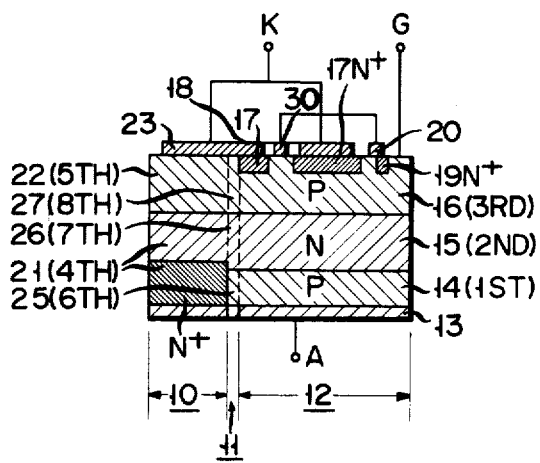
FIG. 6B is a cross-sectional view of the second embodiment, taken along line 6B—6B in FIG. 6A.

In the thyristor shown in FIGS. 6A to 6B, the main emitter region 17 has a through hole which is aligned substantially with the axis of the cylindrical body. Through the hole the third region 16 is partly exposed. On the exposed surface portion of the third region 16 there is provided a center gate electrode 30, which is connected to the arched auxiliary gate electrode 20. A side from these structural aspects, the thyristor is identical with the thyristor illustrated in FIGS. 4A to 4C. The other elements therefore are denoted by the same reference numerals as in FIGS. 4A to 4C, and are not described here. In this thyristor with such a specific structure, the firing area of the main thyristor section expands more quickly than in the thyristor of FIGS. 4A to 4C, once the auxiliary thyristor section which corresponds to the auxiliary emitter region 19 has been fired. For this reason, the thyristor section can withstand more abrupt current change than that of the thyristor of FIGS. 4A to 4C. Also in this embodiment, the cathode electrode 18 and the second electrode 23 are integrally formed, the outer radius $R_1$ of the latter being larger than the outer radius $R_2$ of the former.

In the prior art thyristor shown in FIG. 3B, the circumferential edge of the main emitter region 5 is exposed through the space between the cathode electrode K and the auxiliary gate electrode 7. In other words, circumferential edge of the region 5 does not contact the cathode electrode K. Namely, the main emitter region 5 does not have a so-called circumference shorted structure. As a result, the thyristor section 4 of the prior art thyristor withstands but a low change rate dV/dt of forwardly applied suppression voltage V. In contrast, in each embodiment of this invention a edge portion of the main emitter region 17 is shortcircuited to the cathode electrode 18. For this reason, the thyristor section 12 can withstand a higher voltage change rate dV/dt.

Figure 7:
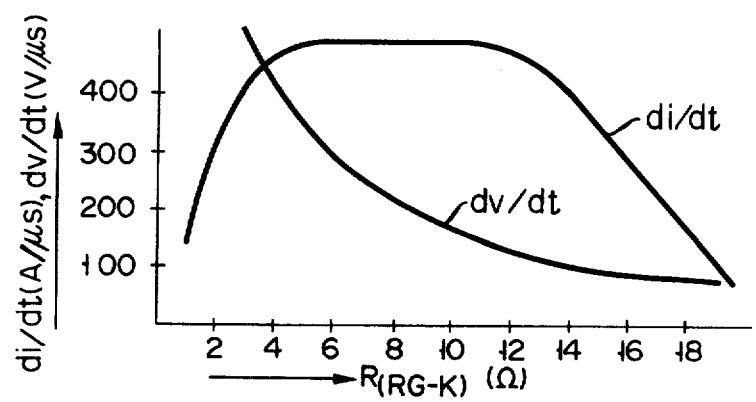
FIG. 7 shows the characteristic curves of dV/dt and di/dt values versus resistance of the semiconductor surface layer between a cathode electrode and an auxiliary gate electrode in the thyristor section of the reverse conducting thyristor of the invention.

As shown in FIG. 7, there exists a specific relationship between the resistance $R_{(RG-K)}$ ($\Omega$) of the semiconductor surface between the cathode electrode 18 and the auxiliary gate electrode 20 and the current change rate di/dt and voltage change rate dV/dt which the thyristor can withstand. Since both di/dt (A/$\mu$) and dV/dt (V/$\mu$s) largely depend on $R_{(RG-K)}$, it is necessary to select the value of $R_{(RG-K)}$ properly. The relationship between dV/dt and $R_{(RG-K)}$ is expressed by the following formula:

$$V > C \times S \times dV/dt \times R_{(RG-K)} = I \times R_{(RG-K)} \qquad \ldots (1)$$

In formula (1), V denotes the threshold voltage (approximately 0.5 V) on the PN junction between the second region 15 and the third region 16, C the capacitance of the PN junction, S the surface area of the semiconductor layer in the thyristor section 12, which is not covered with the cathode electrode 18, and I the displacement current generated in that portion of the semiconductor region whose cross section corresponds to that surface area S. Formula (1) can be transformed into the following formula (2):

$$\frac{dV}{dt} < \frac{V}{C \cdot S} \times \frac{1}{R_{(RG-K)}} . \quad (2)$$

Formula (2) teaches that dV/dt is inversely proportional to $R_{(RG-K)}$. When $R_{(RG-K)}$ surpasses 18, dV/dt becomes smaller than 100 V/μs. This often turns out to be a practical problem to a circuit including the reverse conducting thyristors. In case the thyristor section of the thyristor necessarily withstand a high voltage change rate dV/dt, the upper limit to $R_{(RG-K)}$ should be kept small. In any one of the above-mentioned embodiments, the cathode electrode 18 and the second electrode 23 are either connected electrically or formed integrally. The displacement current generated in the diode section 10 can therefore partly flow into the cathode electrode 18. For this reason, the thyristor section 12 of the thyristor according to this invention can withstand a high voltage change rate dV/dt.

What is claimed is:

1. A reverse conducting thyristor comprising a thyristor section, diode section and a semiconductor separator section interposed between the thyristor and diode sections so as to prevent electrical interference between the thyristor and diode sections, said three sections being integrally formed into a cylindrical body, said thyristor section including a first region of a first conductivity type formed on a first electrode; a second region of a second conductivity type formed on the first region, a third region of the first conductivity type formed on the type formed in the third region, a cathode electrode a part of which is formed on the main emitter region, an auxiliary emitter region formed in the third region, an auxiliary gate electrode formed partly on the third region and partly on the auxiliary emitter region, and a main gate electrode formed on that surface portion of the third region which is adjacent to that lateral surface of the auxiliary emitter region which does not face the main emitter region;

said diode section including a fourth region of the second conductivity formed on the first electrode, a fifth region of the first conductivity type formed on the fourth region, and a part of said cathode electrode formed on the fifth region;

said semiconductor separator section including a sixth region of the first conductivity type formed on the first electrode, a seventh region of the second conductivity type formed on the sixth region, and an eighth region of the first conductivity type formed on the seventh region, said sixth, seventh and eighth regions being integrally formed into a flat plate;

said cathode electrode having a first portion disposed on a first part of said main emitter region and having a radius smaller than that of said first part of said main emitter region and a second portion disposed on said fifth region and on a remaining second part of said main emitter region and having a radius larger than that of said remaining second part of said main emitter region;

said auxiliary gate electrode surrounding the outer periphery of said first portion of said cathode electrode.

* * * * *